(12) United States Patent
Perino et al.

(10) Patent No.: US 6,621,155 B1
(45) Date of Patent: Sep. 16, 2003

(54) INTEGRATED CIRCUIT DEVICE HAVING STACKED DIES AND IMPEDANCE BALANCED TRANSMISSION LINES

(75) Inventors: Donald V. Perino, Los Altos, CA (US); Sayeh Khalili, San Jose, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 09/471,304

(22) Filed: Dec. 23, 1999

(51) Int. Cl.[7] .......................... H01L 23/34; H01L 23/48; H01L 23/02; H05K 7/00
(52) U.S. Cl. ...................... 257/686; 257/685; 257/777; 257/723; 257/691; 257/784; 257/786; 257/665; 257/664; 257/737; 257/738; 257/724; 257/698; 257/531; 257/528; 257/207; 257/208; 257/211; 257/725; 174/52.5; 174/52.3; 174/52.4; 361/790; 361/761
(58) Field of Search ................... 257/678, 691, 257/686, 685, 723, 724, 728, 777, 778, 665, 664, 737, 738, 725, 758, 531, 998, 528, 207, 208, 211; 174/52.4, 52.3, 52.2

(56) References Cited

U.S. PATENT DOCUMENTS

| | | |
|---|---|---|
| 4,500,905 A | 2/1985 | Shibata |
| 4,706,166 A | 11/1987 | Go .............................. 361/403 |
| 4,764,846 A | 8/1988 | Go .............................. 361/388 |

(List continued on next page.)

OTHER PUBLICATIONS

D. B. Tuckerman et al., "Laminated Memory: A New 3–Dimensional Packaging Technology for MCMs," Proc. 1994 IEEE Multi–chip Module Conference, pp. 58–63, (Mar. 1994).

B. C. Wadell, "Transmission Line Design Handbook", copyright 1991 Artech House MA, pp28–31 and 153.

S. Ray, "Rambus ASIC User Guide and Specification", copyright 1993 Rambus Inc. CA pp 25–26, 64–65.

B. Garlepp et al., "A Portable Digital DLL Architecture for CMOS Interface Circuits", Proceedings of the 1998 Symposium on VLSI Circuits, pp. 214–215, (Jun. 1998).

*Primary Examiner*—Alexander O. Williams
(74) *Attorney, Agent, or Firm*—Gary S. Williams; Pennie & Edmonds LLP

(57) ABSTRACT

A multi-chip device which includes a plurality of integrated circuit die disposed one over another. Each integrated circuit die includes one or a plurality of bond pads. One or a plurality of conductors are disposed to electrically couple the bond pads of vertically adjacent integrated circuit die. Each conductor is designed, calculated, specified and/or predetermined to have a length so as to behave as a segment in a multi-drop transmission line. The multi-drop transmission line may be terminated at one end or utilized in a flow-through approach. In one embodiment, an integrated circuit die may be horizontally offset with respect to a vertically adjacent integrated circuit die to expose the periphery region. In another embodiment, each integrated circuit die may be stacked and aligned in a vertical column. In this embodiment, a spacer such as a thermally conductive spacer is disposed between each integrated circuit die in the stack. In yet another embodiment, two or more stacks of integrated circuit die are disposed in the multi-chip device and the one or more multi-drop transmission lines may be implemented in the flow-through approach. The plurality of integrated circuit die may comprise a plurality of memory devices, or a plurality of memory devices and a controller, or a plurality of controllers and a plurality of memory devices.

18 Claims, 14 Drawing Sheets

U.S. PATENT DOCUMENTS

| | | | |
|---|---|---|---|
| 4,879,588 A | * 11/1989 | Ohtsuka et al. | |
| 5,012,323 A | 4/1991 | Farnworth | 174/52.4 |
| 5,247,423 A | 9/1993 | Lin et al. | 361/419 |
| 5,334,962 A | 8/1994 | Higgins et al. | 257/728 |
| 5,481,134 A | * 1/1996 | Sobhani et al. | 257/686 |
| 5,495,398 A | 2/1996 | Takiar et al. | 361/790 |
| 5,600,541 A | 2/1997 | Bone et al. | 257/686 |
| 5,612,657 A | 3/1997 | Kledzik | 361/735 |
| 5,675,180 A | 10/1997 | Pederson et al. | 257/685 |
| 5,696,031 A | 12/1997 | Wark | |
| 5,698,895 A | 12/1997 | Pederson et al. | 257/665 |
| 5,703,436 A | * 12/1997 | Forrest et al. | 313/506 |
| 5,777,345 A | * 7/1998 | Loder et al. | 257/777 |
| 5,804,004 A | * 9/1998 | Tyckerman et al. | 156/60 |
| 5,864,177 A | * 1/1999 | Sundstrom | 257/723 |
| 5,903,736 A | 5/1999 | Novak et al. | |
| 5,998,864 A | * 12/1999 | Khandros et al. | 257/723 |
| 6,005,778 A | * 12/1999 | Spielberger et al. | 257/686 |
| 6,072,700 A | * 6/2000 | Nam | 257/777 |
| 6,093,969 A | * 7/2000 | Lin | 257/777 |
| 6,133,629 A | * 10/2000 | Han et al. | 257/723 |
| 6,180,881 B1 | * 1/2001 | Isaak | 257/686 |
| 6,181,002 B1 | * 1/2001 | Juso et al. | 257/686 |
| 6,215,182 B1 | * 4/2001 | Ozawa et al. | 257/723 |
| 6,229,217 B1 | * 5/2001 | Fukui et al. | 257/777 |
| 6,258,623 B1 | * 7/2001 | Moden et al. | 438/106 |
| 6,376,904 B1 | * 4/2002 | Haba et al. | 257/686 |

* cited by examiner

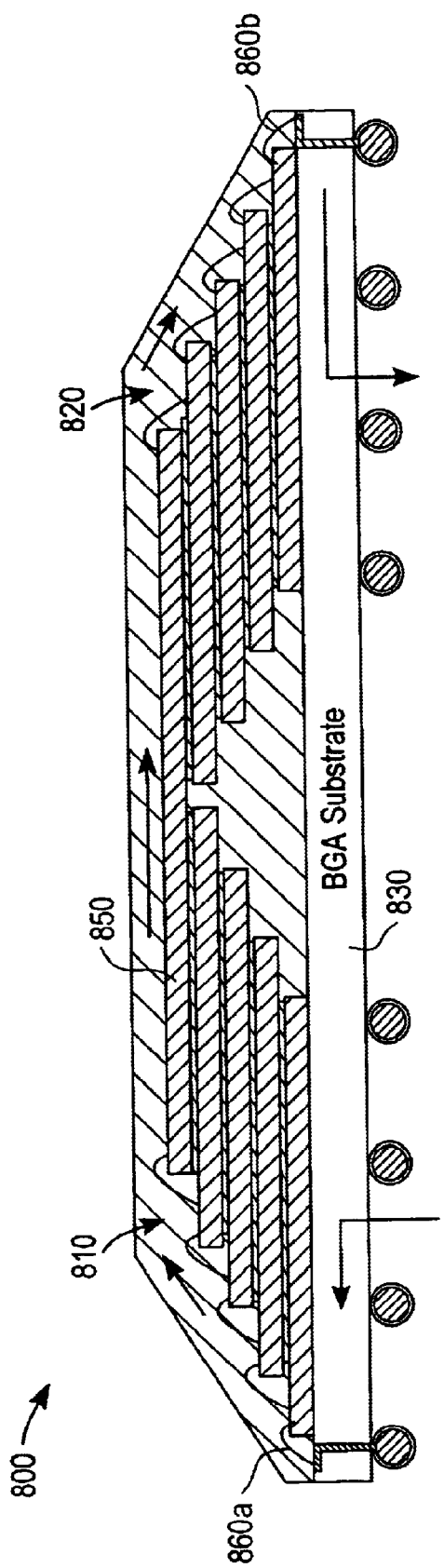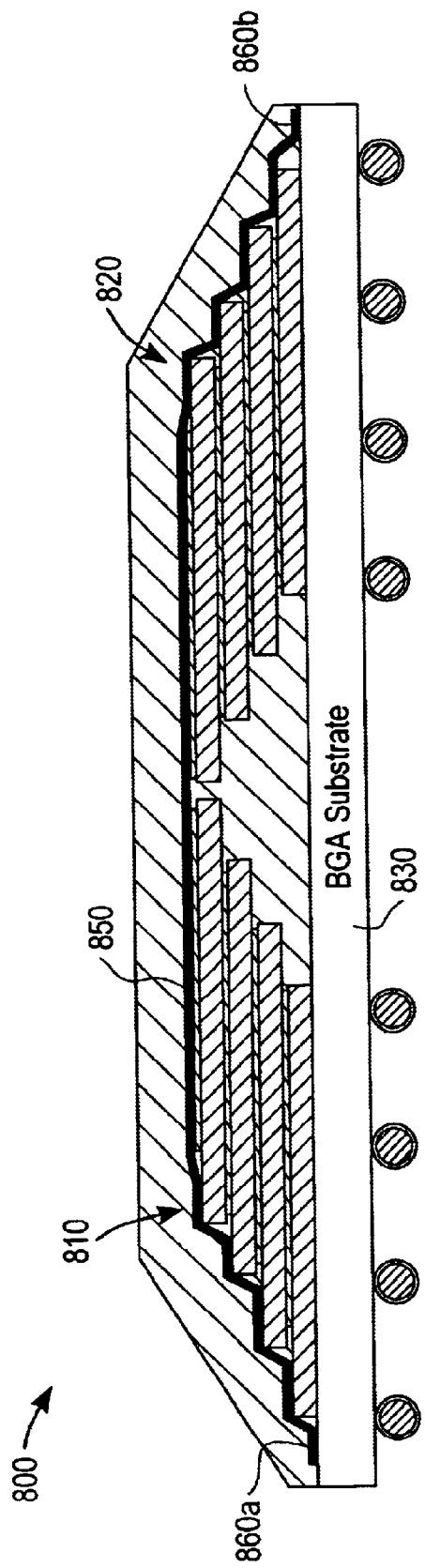
FIG. 7A
FIG. 7B

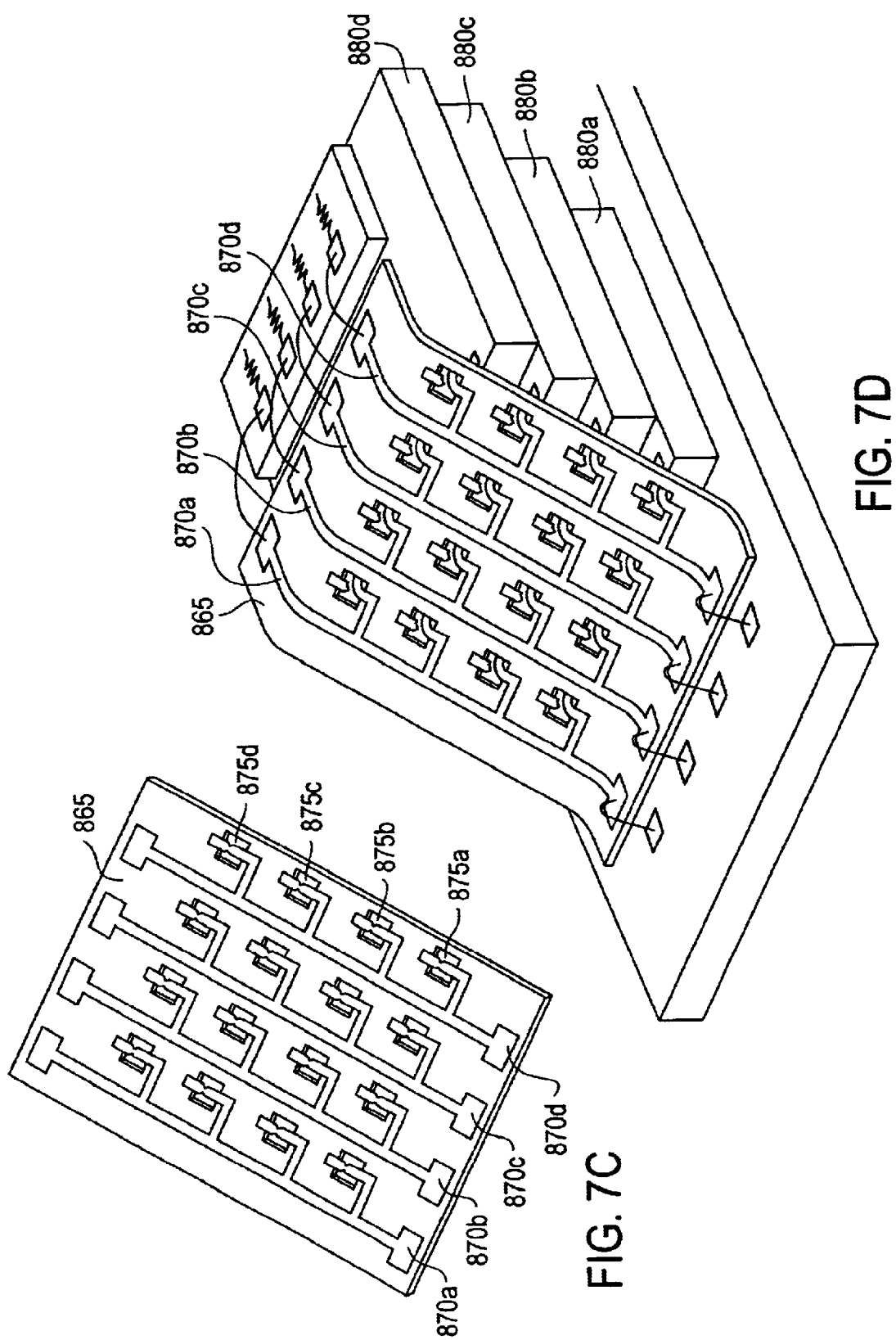

INTEGRATED CIRCUIT DEVICE HAVING STACKED DIES AND IMPEDANCE BALANCED TRANSMISSION LINES

BACKGROUND OF THE INVENTION

This invention relates to a multi-chip or stacked integrated circuit (IC) die device. More specifically, this invention is directed toward a multi-chip device having a plurality of IC die, for example, a plurality of memory die, a controller die and memory die, or a processor, controller and plurality of memory die.

One conventional technique employed to provide greater IC densification includes incorporating several IC die into a single package. There is demand for larger IC densification to more fully utilize system layout space for applications such as portable computers and cell phones. An attractive solution is offered by vertical integration of IC die. That is, a three-dimensional approach where IC die are disposed one on top of another to more fully utilize a vertical dimension.

With reference to FIG. 1, a conventional multi-chip device 100 having a plurality of IC die 110 and 120 disposed one on top of another is illustrated. IC die 110 is stacked on top of IC die 120 which is disposed on base or substrate 130. A plurality of bond wires 140a–140d electrically couple pads disposed on IC die 110 to pads disposed on IC die 120. Similarly, a plurality of bond wires 150a–15m electrically couple pads disposed on IC die 120 to pads disposed on base 130.

The physical configuration of multi-chip device 100 tends to relax demands on system layout space. By disposing the IC die (e.g., memory die) vertically, only a single IC die footprint is required thereby resulting in a reduction in system layout space from a lateral or horizontal perspective. Signal lines 140a–140d for example, control lines and address/clock lines are routed vertically between the IC die 110 and 120.

Contemporary stacked die configurations tend to minimize the length of the signal line path. That is, the contemporary approach for stacked die configurations, is to minimize the electrical path length of the signal lines. A stacked die configuration which seeks to minimize the length of the signal lines is described and illustrated in U.S. Pat. Nos. 5,675,180 and 5,698,895.

Contemporary stacked die configurations, like those described and illustrated in U.S. Pat. Nos. 5,675,180 and 5,698,895, employ a minimum signal line path length in order to decrease propagation delay of the signals on those lines. Decreasing the propagation delay tends to decrease the travel time of the signal between the die and, in turn, increase the speed of operation of the overall system.

In addition to presenting a minimum propagation delay of the signals applied to the signal lines, stacked die configurations employing a minimum signal line path length tend to minimize parasitic capacitance and inductance resulting from the interconnects. In general, this approach may promote faster operation because signal line lengths and corresponding propagation delays are reduced.

FIG. 2A is a schematic diagram of a plurality of conventional IC die in a stacked die configuration coupled to a signal line employing minimal conductor length between each IC die. Here the plurality of IC die 310a–310d are inter-coupled via conductors 320a–320d, respectively. Conductors 320a–320d represent a signal line. Load capacitances 330a–330d represent the load capacitance presented by IC die 310a–310d which are coupled to the signal line. In this regard, when electrically coupling IC die to signal bussing, the signal lines become loaded with the inherent load capacitance which is due to the various elements of the I/O structures disposed on the integrated circuit, for example, bond pads, electrostatic discharge protection devices, input buffer transistor capacitance, and output driver transistor parasitic and interconnect capacitances relative to the memory device substrate.

Because the length of conductors 320a–320d are minimized, conductors 320a–320d exhibit, as a practical matter, negligible inductance. Thus, load capacitances 330a–330d are effectively lumped producing a large overall equivalent or lumped capacitive characteristic. Here, the capacitive characteristic is present between a ground plane 340 which is common to IC die 310a–310d and conductors 320a–320d.

One method for providing an increase in bandwidth and overall performance of a memory system, is to increase the effective data rate at which data may be transferred to and from each memory device (i.e., the data rate). In memory systems, one conventional approach to achieve such an increase is to increase the clock rate of the system, which tends to increase the data rate of the system and, in turn, the bandwidth.

However, as the data rate increases in multi-chip devices which seek to minimize signal line lengths, the lumped capacitive characteristic mentioned above requires increasingly more drive capability from output drivers of the IC die 310a–310d attempting to drive data onto conductors 320a–320c at an increased rate. That is, as the data rate increases, a relatively large amount of current is necessary in the same given period of time to drive the large overall lumped capacitive characteristic at a faster rate. Driver current for an output driver transmitting on an un-terminated lumped capacitive load is illustrated in FIG. 2B. The current demand from drivers of the signal line correspondingly increases with an increase in data rate for a given lumped load capacitance.

As data rates increase in systems employing minimal or short signal lines between IC die of a stacked die device, the number of IC die which may be coupled along the signal line decrease. As mentioned above, minimal or short signal lines between IC die of a stacked die device tend to result in negligible inductance separating each load capacitance along the signal line. Since each IC die increases the overall lumped load capacitance of the signal line in such a system, the maximum practical number of IC devices which may be coupled to the same signal line tends to become constrained or limited by the drive capability of the drivers on the IC die.

Stacked die configurations employing a minimal conductor length provide relatively fast access times. These configurations, however, suffer a number of shortcomings including a limitation on the maximum practical number of IC devices which may be coupled to the same signal line—i.e., a limit on the amount of vertical integration. That is, the minimum interconnect stacked die configurations place high demands on the necessary output drive which imposes an operation speed limitation on the system or a limitation on the number of devices or die coupled to the signal line. Thus, there is a need to provide an effective configuration which has fast access times, increases the operation speed of a multi-chip or stacked die device, and provides more flexibility in vertical integration.

SUMMARY OF THE INVENTION

The present invention relates to a high speed multi-chip device featuring a plurality of integrated circuit die on a base and/or housed in a semiconductor package. In one example, the present invention may be implemented in a memory system incorporating a plurality of memory devices into one or more multi-chip device(s). The present invention employs circuitry and techniques to increase the IC densification and space utilization of, for example, systems implemented on a circuit board. To this end, the present invention employs the vertical dimension to more fully optimize space usage.

The present invention may also be employed to increase computer system operation speed or to provide a high speed memory system. By employing interconnect conductors which include greatly reduced stub lengths and are optimized for high speed operation, the present invention may provide increased data rates and density. Using the approach of the present invention, demands on output drive-ability are more relaxed, thus more devices may be coupled into a system incorporating the techniques of the present invention.

In one aspect, the present invention includes a multi-chip device having a first integrated circuit die, a second integrated circuit die, and a first transmission line. The second integrated circuit die is stacked on the first integrated circuit die. The first transmission line is defined between a first end and a second end, wherein the first end is electrically connected to a first terminal and the second end is electrically connected to a second terminal. A first characteristic impedance is defined between the first terminal and the second terminal. A first conductive pad disposed on the first integrated circuit die, the first conductive pad being electrically connected to a first point on the first transmission line. A second conductive pad disposed on the second integrated circuit die, the second conductive pad being electrically connected to a second point on the first transmission line. A second transmission line may be electrically connected; to the first terminal, the second transmission line having a second characteristic impedance, the second characteristic impedance being matched to (within 70 and 130 percent of) the first characteristic impedance. In addition, a third transmission line may be electrically connected to the second terminal, the third transmission line having a third characteristic impedance, the third characteristic impedance being matched to (within 70 and 130 percent of) the first characteristic impedance.

In another aspect, the present invention includes a multi-chip device having a first and second integrated circuit die stacked and disposed on a base. A first conductor electrically connects the bond pad of the first integrated circuit die to the bond pad of the second integrated circuit die. A first external lead is electrically coupled to the first bond pad and a second external lead is electrically coupled to the second bond pad. The first conductor may be included as a portion of a transmission line. According to this aspect of the present invention, the transmission line may include a characteristic impedance in the range of between 10 to 75 ohms.

In yet another aspect of the present invention, a multi-chip device includes a plurality of integrated circuit die disposed in a stack configuration. Here, each integrated circuit die includes a plurality of bond pads. Each bond pad may be disposed at a periphery region of each integrated circuit die. According to this aspect of the present invention, a transmission line is disposed of a plurality of conductors, each conductor electrically connecting two bond pads. Here, each bond pad of the two are disposed on a pair of adjacent integrated circuit die. A termination element (e.g., a resistor) is connected to an end of the transmission line to terminate the transmission line to a termination voltage. The resistance of the termination element may be matched to the characteristic impedance of the transmission line.

The present invention is described in the detailed description, including the embodiments to follow. The detailed description and embodiments are given by way of illustration only. The scope of the invention is defined by the attached claims. Various modifications to the embodiments of the present invention remain within the scope defined by the attached claims. For example, the plurality of integrated circuit die may be one of a number of different types of integrated circuit devices. Also, the plurality of integrated circuit die may be stacked vertically or horizontally and the edges of adjacent integrated circuit die may be disposed with or without relative dimensional offset with respect to each other.

BRIEF DESCRIPTION OF THE DRAWINGS

In the course of the detailed description to follow, reference will be made to the attached drawings, in which:

FIGS. 7A, 7B, 7C, 7D, 8, and 9 illustrate a cross-section representation of a multi-chip device having a plurality of integrated circuit die formed according to other embodiments of the present invention.

DETAILED DESCRIPTION

Figure 1:
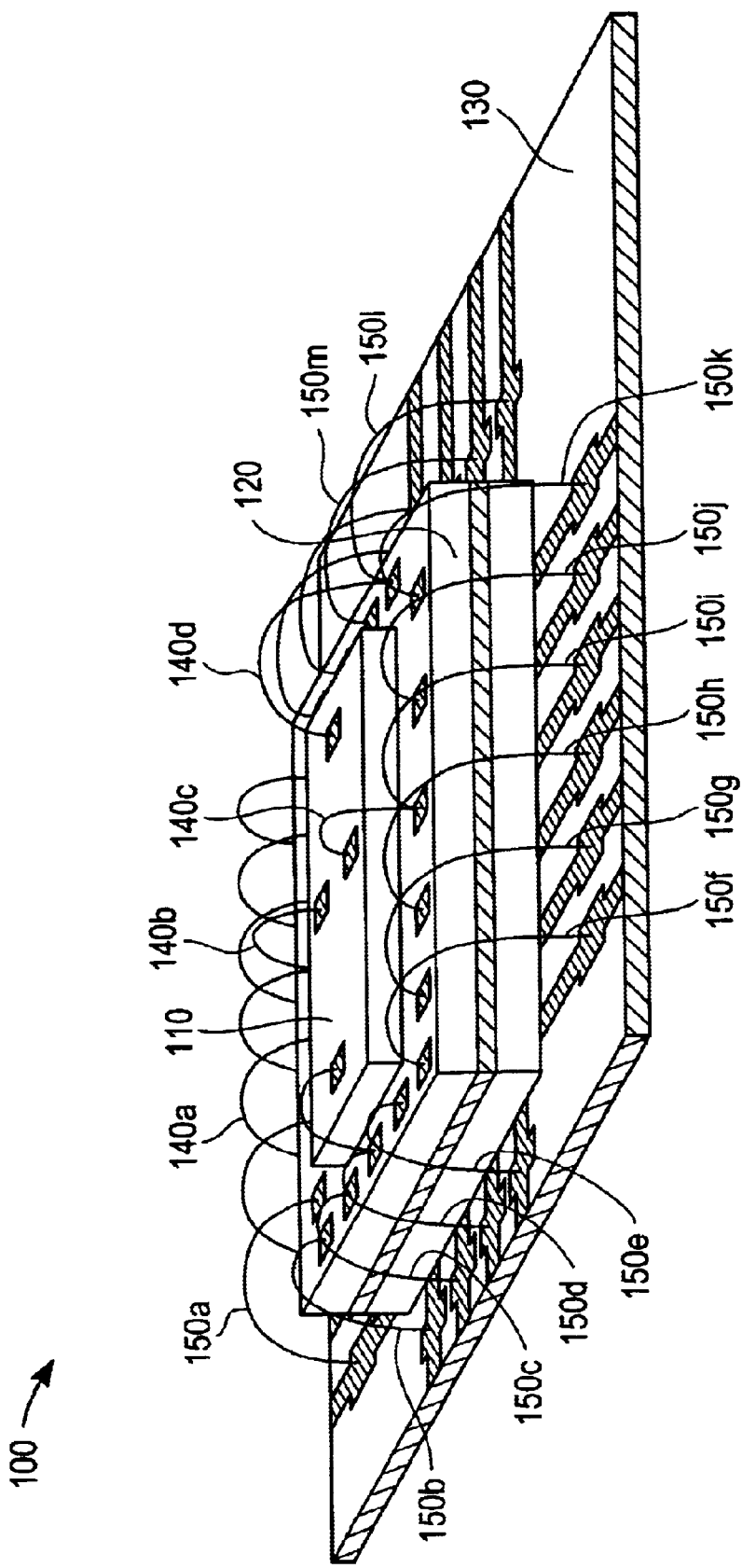
FIG. 1 illustrates a conventional multi-chip device having a plurality of integrated circuit die disposed one on top of another.

The present invention is directed towards a multi-chip device which includes a plurality of stacked integrated circuit (IC) die and a plurality of interconnect signal lines having predetermined line lengths. The plurality of IC die (for example, a dynamic random access memory (DRAM)) may be housed in a package using conventional IC packaging techniques, or disposed on a base having connectors such as ball bonds or leads for connecting to external signal lines or interfacing with external circuitry or devices. The plurality of interconnect signal lines electrically couple or interconnect the IC die and, under circumstances where the IC die are disposed on a base or substrate, interconnect the IC die to the base or substrate as well. The plurality of signal lines may integrate a high speed bus or a "flow-through" portion of a high speed bus along with the plurality of integrated circuit die in or on the multi-chip device. The predetermined line lengths may be selected to match the characteristic impedance of the interconnect signal lines to external signal lines (or transmission lines).

The present invention employs circuitry and techniques to increase the IC densification, optimize space utilization, increase speed, and relax output driver current in a multi-chip device. According to the present invention, a plurality of IC die occupy the horizontal or lateral area equivalent to one IC die footprint. Utilization of the vertical dimension more fully optimizes space usage in, for example, a memory system implemented on a circuit board.

The present invention may be employed to increase computer or memory system operation speed relative to contemporary systems and/or ease demands on internal device output drive-ability. For example, using the techniques of the present invention, a plurality of high speed memory devices (e.g., eight die or devices) may be optimized in a multi-chip device to operate at a substantially increased data rate (e.g., greater than 400 MBits/sec) as compared to data rates of conventional memory systems (e.g., 100–400 MBits/sec). The present invention employs transmission line techniques to provide high frequency range operation and increased bandwidth.

In one embodiment, the multi-chip device includes a plurality of IC devices coupled to at least one multi-drop transmission line. The end of the multi-drop transmission line may be terminated to a termination voltage using a termination element (e.g., a resistor or resistive element). Conductors or interconnect segments comprising the multi-drop transmission line are coupled between each IC device. In one embodiment, the multi-drop transmission line has a controlled impedance that is produced by a selected, calculated and/or predetermined length of conductors coupled between each drop point. In one example, the internal transmission line impedance is predetermined or selected in accordance to the impedance of an external signal line to prevent or minimize signal reflections.

In another embodiment, the multi-chip device includes a plurality of IC devices coupled in a flow-through bus configuration. Here, the plurality of IC devices are coupled to at least one multi-drop transmission line. Both ends of the multi-drop transmission line couple to circuitry which is external to the multi-chip device via, for example, ball bonds or pins. In this embodiment, a portion of a transmission line bus may be realized directly within the multi-chip device itself using a flow-through approach. A plurality of multi-chip devices may be coupled in a serial configuration permitting the signals to propagate past each multi-chip device in serial fashion. By bringing the bus closer to the integrated circuit die, the lengths of stubs (i.e., conductors which electrically connect the signal lines of the bus to the circuitry on the IC die) are reduced and operation speeds may be increased significantly compared to conventional systems which feature conventional IC devices having leads coupled to a transmission line bus on an external printed circuit board.

Figure 3A:
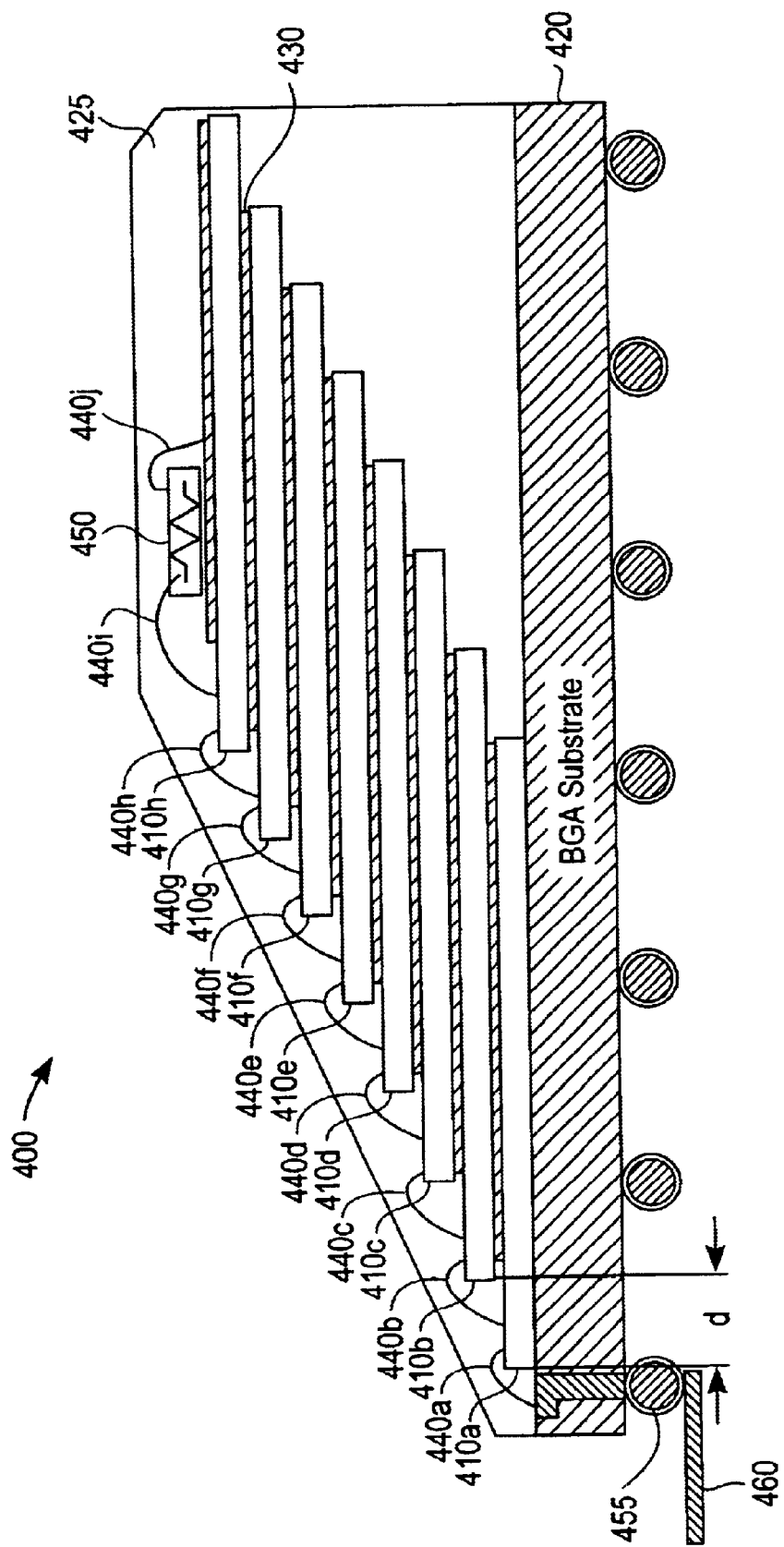
FIGS. 3A, 3B, 3C and 3D illustrate representational cross-section views of a multi-chip device formed in accordance to embodiments of the present invention.
Figure 3B:
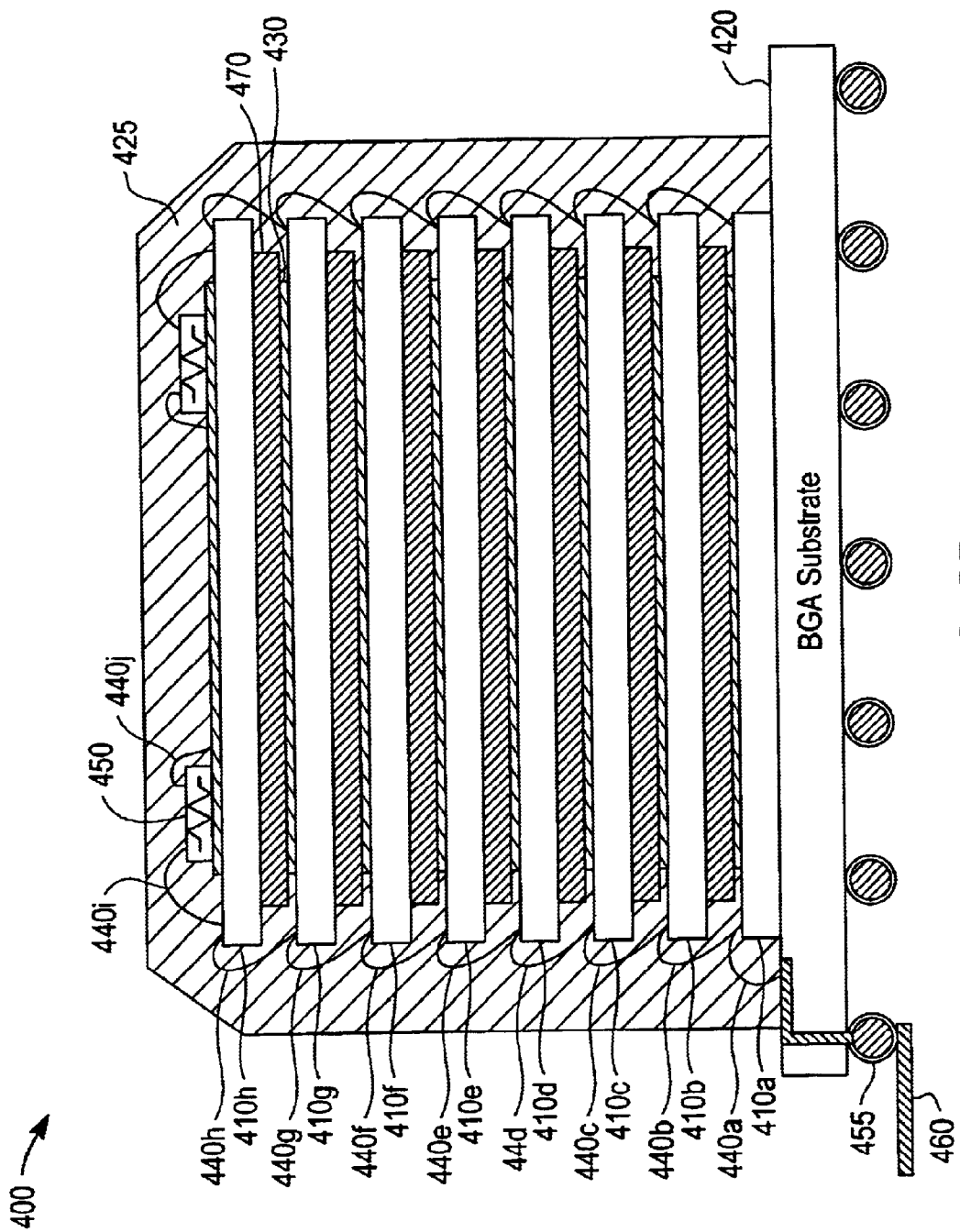
Figure 3C:
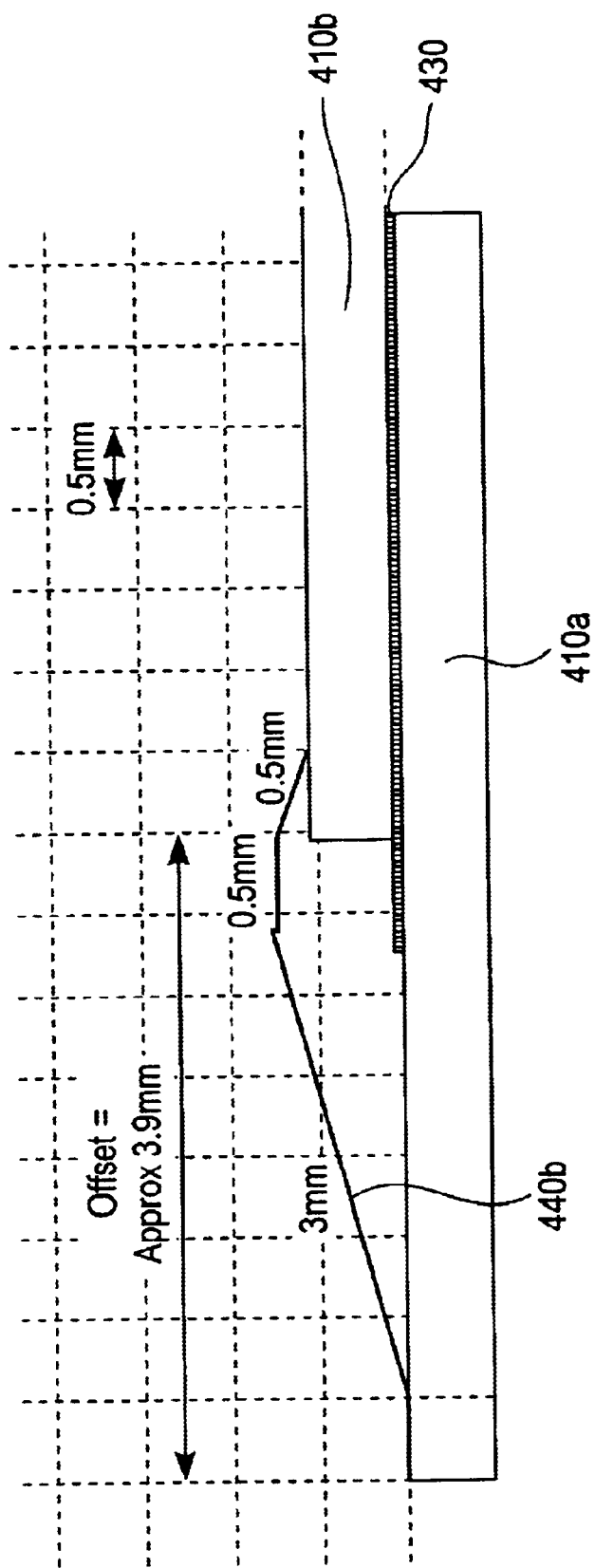
Figure 3D:
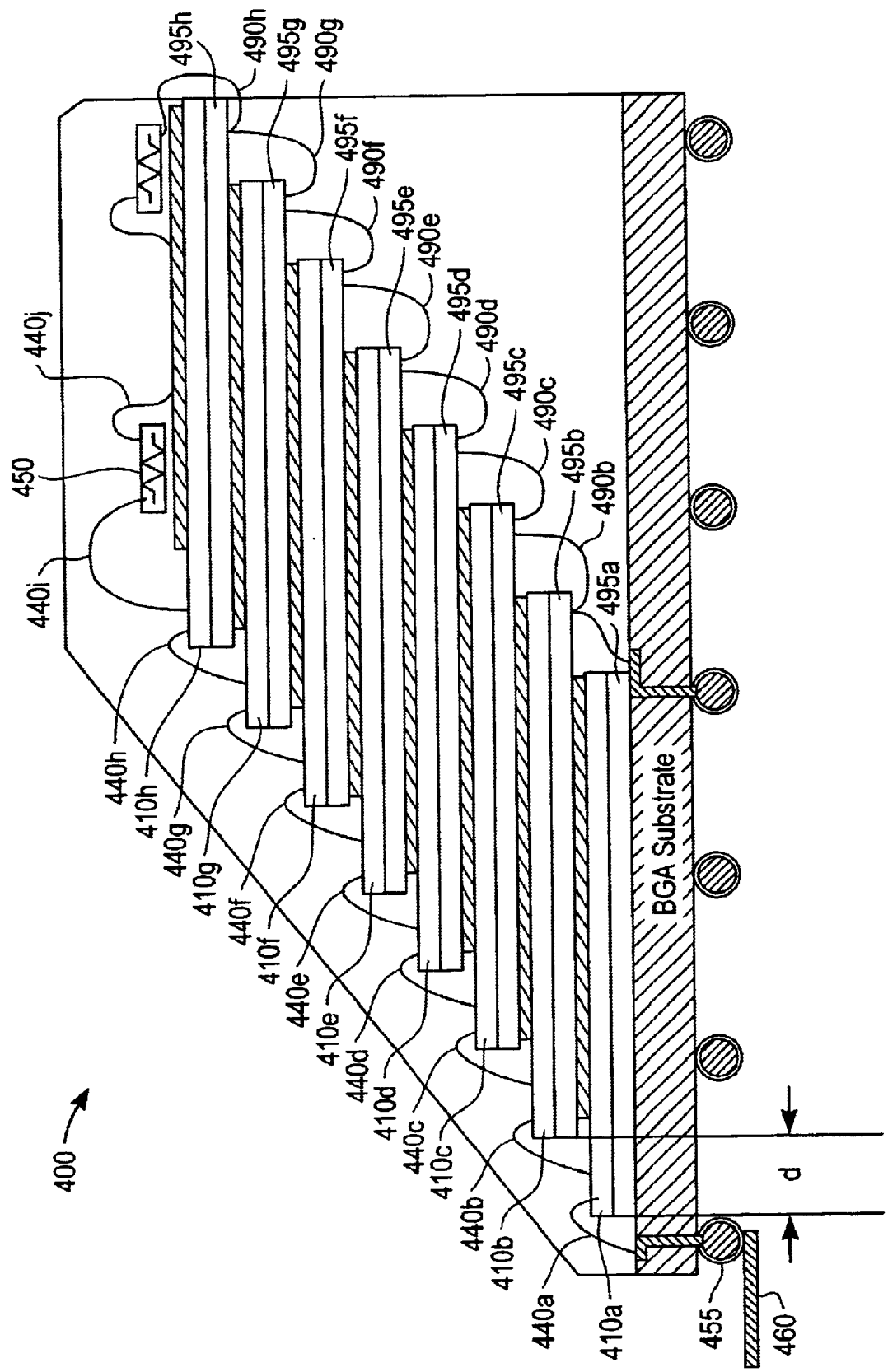

With reference to FIGS. 3A, 3B, and 3D, representational cross-section views of a multi-chip device formed in accordance with embodiments of the present invention is are illustrated. Multi-chip device 400 includes IC die 410a–410h, base 420, spacer 430, conductors 440a–440i, and termination element 450. IC die 410a–410h are disposed on base 420. IC die 410a–410h are disposed one on top of another in a "stacked" configuration. Alternatively, IC die 410a–410h may be disposed side by side, or edge to edge on a two dimensional plane while incorporating the techniques of the present invention.

Conductors 440a–440i interconnect IC die 410a–410h and resistor 450. Conductors 440a–440h are coupled between bond pads (not shown) on adjacent die of IC die 410a–410h. That is, conductor 440a is connected between substrate 420 and bond pad(s) on IC die 410a, conductors 440b–440h are connected between bond pads on IC die 410a–410h, conductor 440i is connected between bond pad(s) on IC die 410h and termination element 450, and conductor 440j is connected between termination element 450 and a termination voltage (not shown), for example, Vcc. Conductors 440a–440j may be formed using various technologies such as wire bonding, or flexible circuit tape. In accordance with this specific embodiment of the present invention, conductors 440a–440j or conductors 440b–440j form a transmission line.

With continued reference to FIGS. 3A, 3B, and 3D, base 420 may be a common IC substrate such as a ball grid array (BGA) substrate or pin grid array (PGA). IC die 410a–410h may be mounted on base 420 and encapsulated, for example, in epoxy over-mold 425. Connectors such as leads or ball bonds couple the transmission line to external devices, for example, a memory controller, other multi-chip devices, or bus transceivers via external signal lines or external transmission lines. For simplicity, only one connector, electrically connected to external transmission line 460 is shown. Similarly, only one transmission line comprising conductors 440a–440h coupled to external transmission line 460 via connector 455 is shown. A plurality of connectors, such as ball bonds or leads may couple respective transmission lines to a corresponding plurality of external signal lines.

Impedance ratios are often employed in determining how well signal energy is transported between the external signal line and the transmission line (i.e., conductors 440a–440j and associated load capacitances). The characteristic impedance value of the external transmission line 460 may be matched to the characteristic impedance of the internal transmission line using various techniques described below. These characteristic impedance values may be suitably matched to optimize the signal energy transport or to substantially eliminate signal reflection from occurring.

With further reference to FIGS. 3A, 3B, and 3D, termination element 450 terminates an end of the transmission line to a termination voltage (not shown), e.g., Vdd or GND. Termination element 450, in a preferred embodiment, is a resistor or resistive element which is matched to the characteristic impedance of the internal transmission line. For example, each of conductors 440a–440j may be selected as 4 mm length bond wires in forming a transmission line with characteristic impedance of 28 ohms. The length, diameter, and inductance of these bond wires are ready examples of parameters which significantly impact the characteristic impedance of the internal transmission line. Termination element 450 may be selected as a 28 ohm resistor to match the transmission line impedance of 28 ohms. It should be noted that termination element 450 may be appropriately selected to avoid or minimize signal reflections from occurring when multi-chip device 400 is in operation.

It should be noted that termination element 450, although illustrated as external to the IC die 410, may be implemented on one or more of the IC die 410. U.S. Pat. No. 6,308,232 describes and illustrates implementing a termination element on at least one IC die in a memory system/subsystem environment. Commonly owned U.S. Pat. No. 6,308,232 is hereby incorporated by reference.

In the embodiment illustrated in FIGS. 3A and 3D, an edge of each IC die may be horizontally offset, positioned or skewed by a distance "d" (for example, d is approximately 3.9 mm) with respect to an edge of a vertically adjacent IC die. The offset feature, in conjunction with the conductor layout, is illustrated in more detail in FIG. 3C. The offset feature may be employed to allow a predetermined spacing between pads on adjacent IC die. The lengths of each conductor electrically connected between the pads may be selected in accordance to the predetermined spacing in an embodiment of the present invention.

Spacer 430, (e.g., polyimide) is disposed between vertically adjacent IC die. Spacer 430 may be disposed to adjust or allow clearance for coupling conductors between two adjacent IC die and/or for thermal considerations. In one embodiment, the spacer material includes a thickness of 0.5 mm and each die includes a thickness of 0.06 mm.

With reference to FIG. 3B, a plurality of IC dies 410a–410h are disposed and aligned as a single column instead of being horizontally offset with respect to one another as is shown in FIG. 3A. Here, the back of each IC die is disposed over the face of each IC die positioned immediately underneath in a stack configuration. Alternatively, IC die 410a–410h may be disposed back to back, face to face or in a combination thereof. In addition, the plurality of IC die may be disposed horizontally with an edge of each IC die disposed on a common horizontal plane. This is equivalent to rotating the multi-chip device stack configuration illustrated in FIG. 3B by ninety degrees.

By disposing each of IC die back to back, pads disposed at a periphery region of an adjacent or opposite edge of each die may be coupled to conductors as shown in FIG. 3D. Here, conductors 490b–490h are coupled between bond pads (not shown) on adjacent die of IC die 495a–495h. Back sides of each of IC die 495a–495h are attached to back sides of IC die 410a–410h.

With continued reference to FIG. 3B, a thermally conductive spacer 470 is disposed between adjacent IC die. Here, thermally conductive spacer 470 aids in dissipating heat generated when in operation. It should be noted that thermally conductive spacer 470 may also be implemented in the embodiments of FIGS. 3A and 3D.

FIGS. 3A and 3D illustrate one conductor coupled between pairs of adjacent IC die. It should be noted that IC die 410a–410h each may include a respective plurality of bond pads for coupling a plurality of conductors between two adjacent IC die. This is illustrated in FIG. 4B. Here, a plurality of pads 550a–550d are disposed on a periphery region of IC die 410a–410h. Conductors, for example, bond wires, may couple pads aligned proximally on vertically adjacent IC die.

With continued reference to FIG. 4B, each conductor may be considered as an impedance in a multi-drop transmission line. Each of pads 550a–550d may be considered as a drop point at which each load of the multi-drop transmission line is coupled thereto. Each of pads 550a–550d may be spaced equidistant from one another and/or have identical structures to match electrical characteristics which may be effectuated by the IC substrate, electrostatic discharge protection devices, input transistors, output drivers, and input/output (I/O) interconnect layout parasitics, etc. Each of pads 550a–550d and associative circuit features, (e.g., input receivers, electrostatic discharge protection devices, output drivers, on-chip interconnect, etc) typically contribute a capacitive load characteristic to the multi-drop transmission line. By connecting the transmission line directly on the bond pads of the IC die (see FIGS. 3A, 3B, 3D, 7A and 7B), the need for conventional I/O structures (such as package leads) which may typically contribute to longer stub lengths are eliminated. Decreasing stub lengths minimizes discontinuities along the transmission line and permits the impedance of the transmission line to be more readily controlled.

According to one aspect of the present invention, one important electrical characteristic stems from the inductance to capacitance ratio associated with each conductor and capacitive load coupling vertically adjacent pads. The inductance to capacitance ratio is often described in terms of characteristic impedance by taking the square root thereof. By substantially matching characteristic impedance of a transmission line formed by conductor 440b–440h (FIGS. 3A and 3B) and associated I/O load capacitances, optimum energy transfer occurs.

A reflection coefficient is indicative of the relative amount of signal reflection (e.g., voltage reflection) which may occur at a point or junction of two impedances e.g., the point where conductors 440a–440j meet external transmission line 460. Characterizing conductors 440a–440j by an impedance Zo", and external transmission line 460 by an impedance Zo', reflection percentages and reflection coefficients for an example Zo' value of 50 ohms and corresponding range of Zo" values is shown in table 1. If Zo', Zo" and termination element 450 (FIGS. 3A, 3B, and 3D) are perfectly matched, then the reflection coefficient is zero and perfect matching of impedances occurs. Instead of being perfectly matched, impedances Zo' and Zo" may be matched to be within a range of each other. That is Zo' and Zo" may be matched in a range of impedance values that may result in small reflections. It should be noted that termination element 450 is assumed to be perfectly matched to Zo" in the example above.

For example, in an embodiment according to the present invention, impedances Zo' and Zo" may matched in the range of between approximately 70 and 130 percent. In table 1, this range corresponds to a range of reflection coefficients of between approximately minus eighteen and twelve. Relative reflections outside of this range may be detrimental to operation, depending on the margins employed in the signaling scheme. Margins are typically threshold points which distinguish between voltage or current amplitudes and corresponding symbol representations or definitions.

TABLE 1

| Zo' (ohms) | Zo" (ohms) | coefficient of reflection | % match |
|---|---|---|---|
| 50 | 27 | −30 | 54 |
| 50 | 29 | −27 | 58 |
| 50 | 32 | −22 | 64 |
| 50 | 35 | −18 | 70 |
| 50 | 39 | −12 | 78 |
| 50 | 42 | −9 | 84 |
| 50 | 47 | −3 | 94 |
| 50 | 50 | 0 | 100 |
| 50 | 52 | 2 | 104 |
| 50 | 57 | 7 | 114 |
| 50 | 63 | 12 | 128 |
| 50 | 69 | 16 | 138 |
| 50 | 76 | 21 | 152 |
| 50 | 83 | 25 | 166 |
| 50 | 92 | 30 | 184 |

Figure 5A:
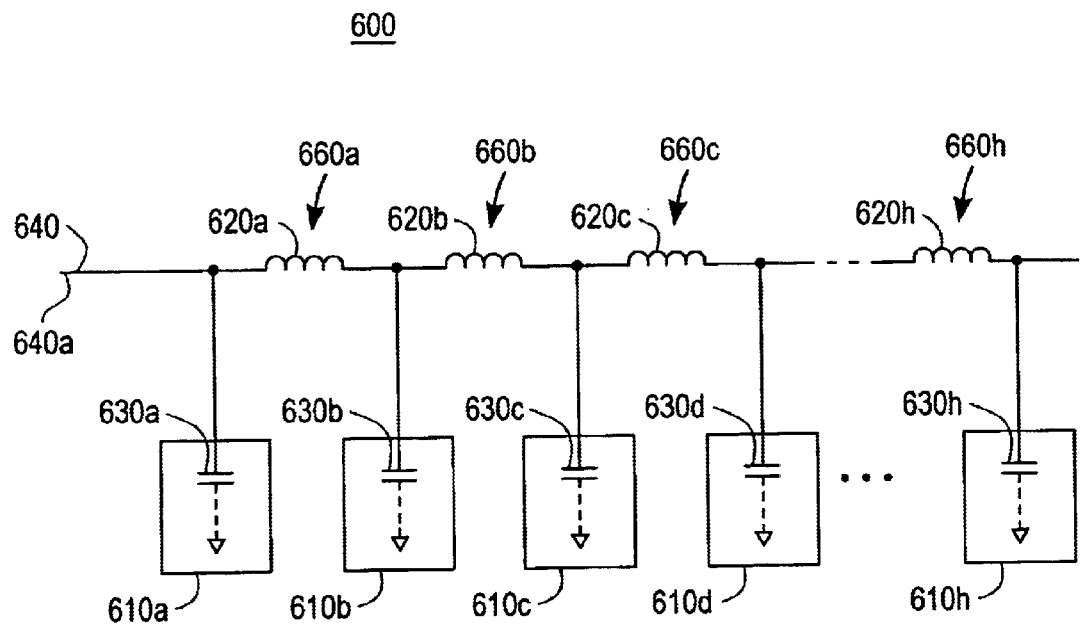
FIG. 5A illustrates a schematic of a multi-drop transmission line according to an embodiment of the present invention.
Figure 5B:
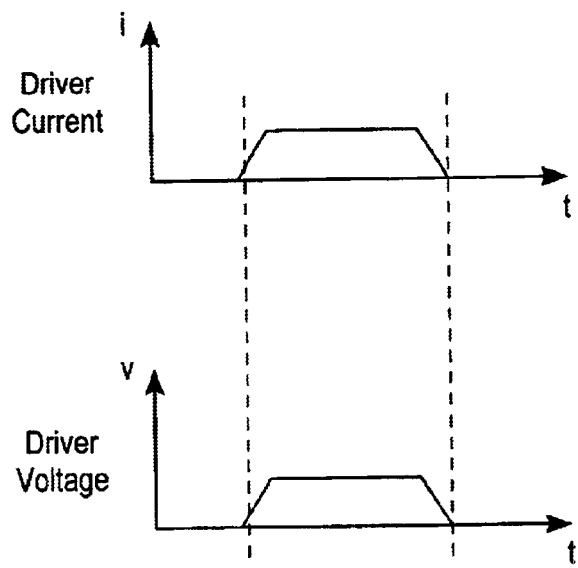
FIG. 5B illustrates driver current for an output driver driving a terminated transmission line in accordance to an embodiment of the present invention.

FIG. 5A illustrates an electrical representation of a multi-drop transmission line in accordance with an embodiment of the present invention as illustrated in FIGS. 3A and 3B. Multi-drop transmission line 600 is employed in multi-chip device 400 to couple pads on IC die 410a–410h and termination element 450 (FIGS. 3A, 3B, and 3D). In FIG. 5A, IC die model 610a–610h include equivalent load capacitances 630a–630h to a common or ground potential. In this embodiment, a plurality of equivalent inductance elements 620a–620h are coupled between each equivalent load capacitance 630a–630h of each IC die model 610a–610h. Each equivalent inductance element 620a–620h models a conductor having a calculated, derived, predetermined, substantially equal, uniform or non-minimum length.

End 640 may be coupled to an external signal line having a calculated, predetermined, simulated or approximated "external" characteristic impedance value. This "external" characteristic impedance value may be utilized in forming the multi-chip device in accordance to another embodiment illustrated below.

Figure 2A:
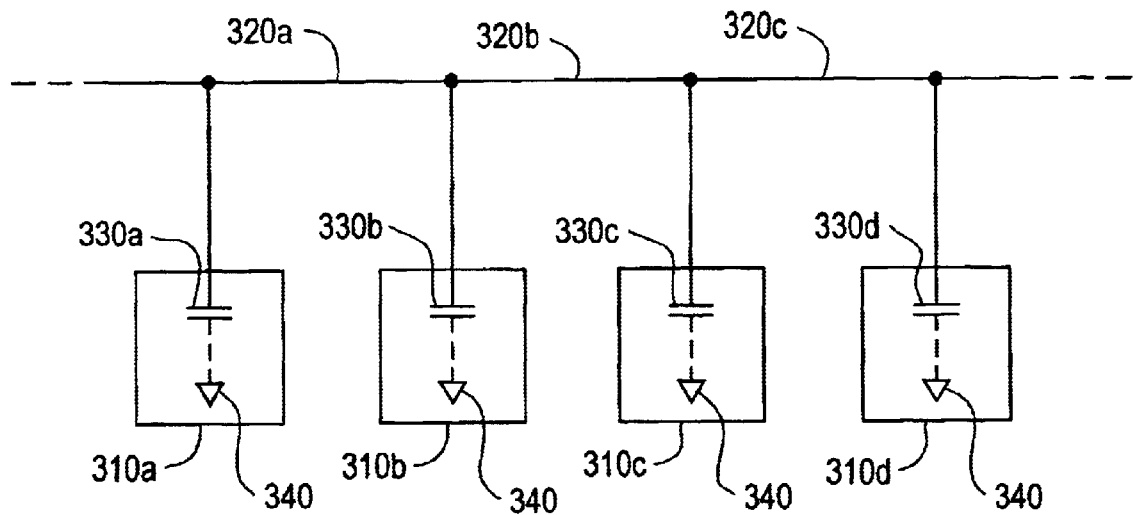
FIG. 2A illustrates a schematic representation of a plurality of integrated circuit die coupled to a signal line according to conventional configurations employing minimal conductor length between devices.
Figure 2B:
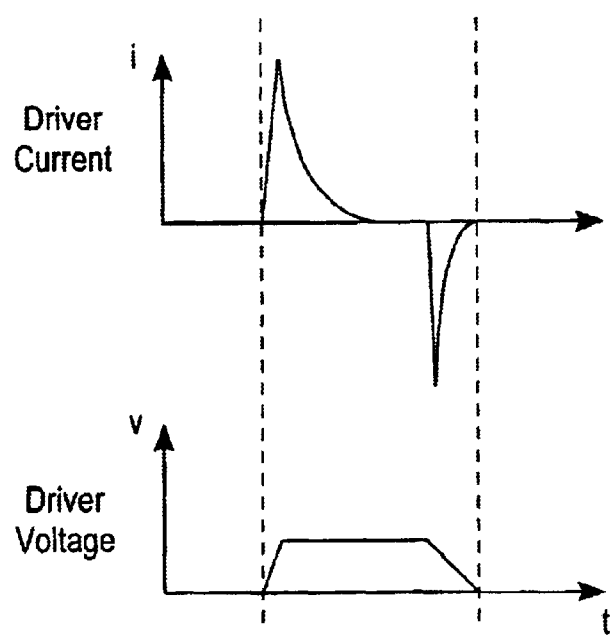
FIG. 2B illustrates driver current in an output driver driving a lumped capacitive load.

In operation, equivalent inductance elements 620a–620h and equivalent load capacitances 630a–630h may relate a given propagation delay time between adjacent load capacitances. By introducing the delay time, each of load capacitances 630a–630h is charged in a more serial fashion by a signal being driven from one signal line end 640. This results in a relatively smaller amount of current required to drive the signal line than the multi-chip device employing the minimum interconnect approach. This is illustrated in FIG. 5A when compared to the driver current characteristic in the un-terminated lumped capacitive example illustrated in FIG. 2B.

The minimum interconnect approach employed in the conventional multi-chip device described above produced more of a large lumped capacitive characteristic thus requiring a relatively larger amount of current drive by the drivers. By way of comparison, the lumped capacitance effect is avoided in the present invention and smaller sized driver circuits may be used due to the smaller current drive requirements. Smaller sized driver circuits occupy less area on an IC die and tend to be easier to realize. In addition, since demands on output drive-ability of each IC die is more relaxed, an increased number of IC may be coupled along a transmission line in the multi-chip device.

Based on a minimum impedance ($Z_{min}$) and load capacitance ($C_{load}$), one method for determining an optimized minimum inductance value for the inductance elements 620a–620d illustrates an aspect of the present invention. The minimum impedance $Z_{min}$ of the bond wire may be calculated by dividing the desired voltage swing (dv) on the signal line by the amount of current (i) to be driven on the signal line (i.e., $Z_{min}$=dv/i) by an IC die (i.e., by an output driver). The minimum inductance $L_{min}$ may be then calculated using the relationship:

$$L_{min} = (Z_{min} \times \sqrt{C_{load}})^2$$

wherein, $C_{load}$ is the load capacitance exhibited by the IC die.

For example, in a specific embodiment, IC die presents a load capacitance of 2.2 pF and utilizes a voltage swing of 800 mV along with a driver current (i) of 26.7 mA. Substituting in the equation above yields an $L_{min}$ of 1.57 nH.

Based on the resonant frequency ($\omega_0$), an example method for determining an optimized maximum inductance value for the conductors may be illustrated. For example, the maximum inductance $L_{max}$ may be calculated using the relationship:

$$L_{max} = \left( \frac{1}{2\pi \times \omega_o \times \sqrt{C_{load}}} \right)^2$$

For example, where the operation frequency is 500 MHz, as a rule of thumb, the resonant frequency ($\omega_0$) of, for example, a bond wire implemented in one of the conductors 440a–440i in FIG. 3A, should be higher than the third harmonic (i.e., greater than 1.5 GHz) of the operating frequency. Substituting 1.5 GHz as the resonant frequency $\omega_0$, and load capacitance of 2.2 pF into the equation above yields a maximum inductance ($L_{max}$) of 5.12 nH.

Thus, in the foregoing example, the target inductance range for each of the inductance elements 620a–620d is between 1.57 nH and 5.12 nH. In calculating the target inductance range, a conductor having a predetermined length may then be formed to suit the physical constraints of the multi-chip device. For example, by applying the above range to a bond wire having an inductance of 1 nH per 2.5 mm yields a conductor having a length in the range of between 4 mm and 12.8 mm.

The specific impedance values, frequencies, dimensions, and relationships between the same are provided as examples only. Other methods may be employed to select, determine, calculate, define or control the inductance of conductors 660a–660h to create the multi-drop transmission line 600. For example, a field solver (a software tool which calculates the spatial and temporal distributions of electric and magnetic fields in the system) or a computer program performing simulations which include factors based on parasitics and/or electromagnetic phenomena may be employed. Moreover, other types of calculations and/or factors may be deemed more appropriate based on the specific multi-chip device application or operation frequency.

Figure 6A:
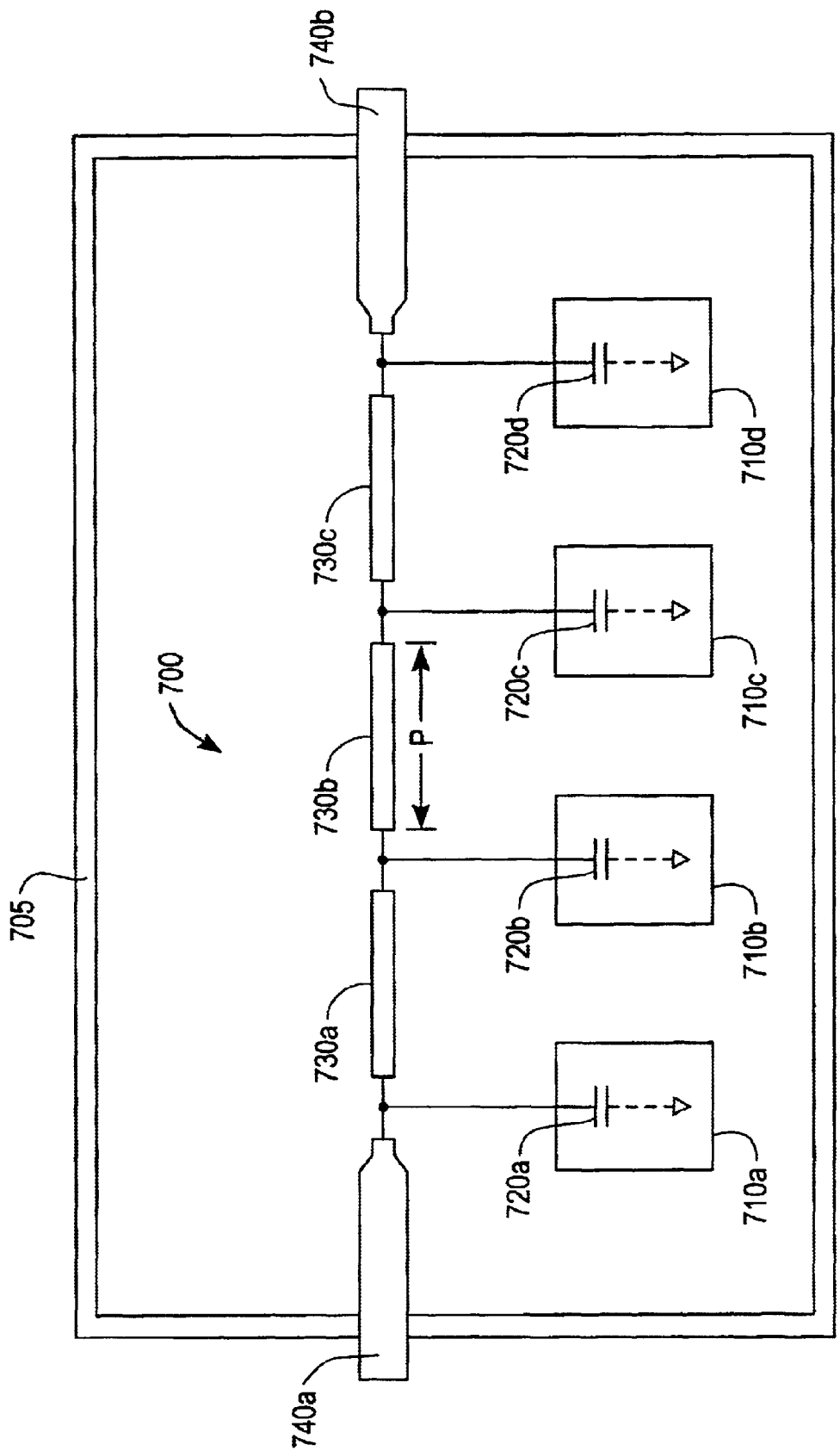
FIGS. 6A, 6B, 6C, and 6D illustrate schematics of a multi-drop transmission line and multi-chip devices formed in accordance to embodiments of the present invention.

With reference to FIG. 6A, a schematic diagram of a multi-drop transmission line formed in accordance to an embodiment of the present invention is illustrated. Here, multi-drop transmission line 700 may be employed to calculate the unit length of conductors 730a–730c to match impedance between multi-drop transmission line 700 and the characteristic impedance of one or more external signal line connected thereto. Multi-drop transmission line 700 is housed inside IC package 705 of a multi-chip device. This example is equally applicable in disposing conductors in, for example, multi-chip device 400 of FIGS. 3A and 3B.

A plurality of IC device models 710a–710d include representative load capacitances 720a–720d each coupled to a transmission line comprising conductors 730a–730c. Signal lines 740a and 740b represent external signal lines, for example, external signal lines of a bus. In this configuration, the transmission line may model a portion of a bus which may be impedance matched to adjacent external portions thereof for optimal, high speed operation.

According to an embodiment of the present invention, the characteristic impedance of signal lines 740a and 740b along with the unloaded impedance of conductors 730a–730c may be employed to dispose the pitch "P" of each conductor 730a–730c. In this specific embodiment, external signal lines 740a and 740b include a wider section than conductors 730a–730c. Since the impedance of a conductor decreases as the width of the conductor is increased, the impedance observed at signal lines 740a and 740b is less than the impedance of conductors (i.e., 730a–730c). This is assuming a constant dielectric characteristic and an unloaded state (i.e. with no load capacitances 720a–720d attached to the transmission line). Although different widths are shown, other physical characteristics may dispose mismatched impedance between transmission line 700 and signal lines 740a and 740b in the unloaded state. The impedance of conductors 730a–730c will decrease when load capacitances 720a–720d are connected to conductors 730a–730c as shown in FIG. 6A. In this specific embodiment, pitch "P" is calculated to yield a specific "loaded" impedance ($Z_L$) to match the characteristic impedance of signal lines 740a and 740b to the characteristic impedance of a transmission line formed by conductors 730a–730c along with load capacitors 720a–720d. As such, spacing "P" may be calculated using the relationship:

$$P = \frac{C_{Load}}{\frac{L}{Z_o^2} - C}$$

where: $C_{Load}$ represents common load capacitances 720a–720d;

$Z_0$ is the characteristic impedance of conductors 730a–730c (matched to the signal lines 730a–740d); and L and C are distributed inductance and capacitance values respectively.

It should be noted that other methods may be employed to determine, calculate, define or control the length of conductors 730a–730c to create the multi-drop transmission line model 700, for example, computer assisted layout and modeling. In addition, other methods may be employed to match the multi-drop transmission line impedance to external signal lines, for example, field solvers may be employed to calculate the capacitances and inductances in a memory system.

Figure 6B:
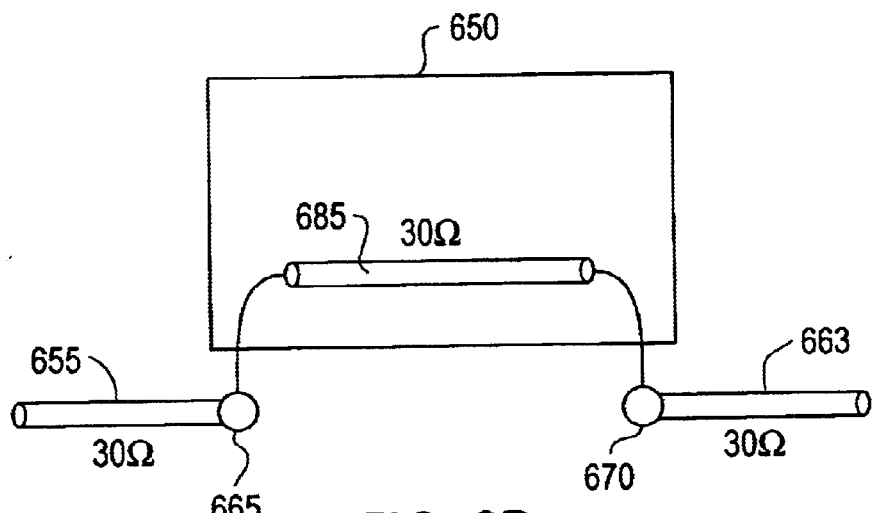
Figure 6C:
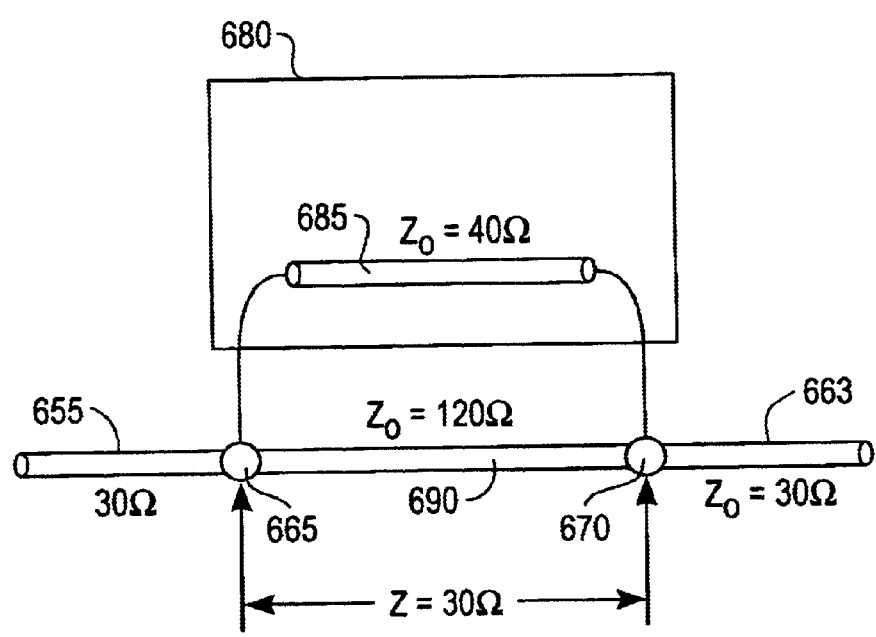

Another approach employed to match the impedance of the multi-drop transmission line to the impedances of external transmission lines (i.e., signal lines) may utilize an additional internal/external transmission line, stub, or means to alter the impedance between a pair of 10 terminals defining the impedance to be matched. To exemplify this approach, FIGS. 6B and 6C illustrate embodiments of a multi-chip device coupled to external transmission lines in a "flow-through" approach. FIG. 6C illustrates the employment of an additional transmission line to match the impedance viewed between two terminals. The "flow-through" approach is described in more detail below with reference to FIGS. 7A and 7B and is shown here by way of example. The techniques employed to match impedances using one or more additional transmission lines may apply to the terminated approach described above and shown in FIG. 6D.

In the embodiment of FIG. 6B, impedances of transmission lines 655 and 663 are substantially matched to the impedance of multi-drop transmission line 685. Multi-drop transmission line 655 includes an impedance of 30 ohms and is electrically connected to transmission lines 685 and 663 at terminals 665 and 670 respectively. The multi-drop transmission line impedance viewed between terminals 665 and 670 and transmission lines 655 and 663 are each 30 ohms, respectively. Thus, the impedances of transmission lines 655, 663 and multi-drop transmission line 655 are substantially matched (e.g., within 70–130 percent). These impedances may also be matched to within a range of each other as described above. Moreover, a plurality of transmission lines may be employed in like fashion with the techniques described herein.

In FIG. 6C, the same numbers are utilized to connote like elements in multi-chip device 680. Multi-drop transmission line 685 includes an impedance of 40 ohms and is electrically connected in parallel with external transmission line 690 disposed between terminals 665 and 670. An impedance (Z) of 30 ohms results between terminals 665 and 670 from the parallel combination of the 40 ohm impedance of multi-drop transmission line 685 and the 120 ohm impedance of external transmission line 690. The impedance of external transmission line is 690 selected to substantially match impedances in the system. By matching impedances, similar delays result between terminals 665 and 670 when multi-chip devices 650 and 680 are in operation.

Figure 6D:
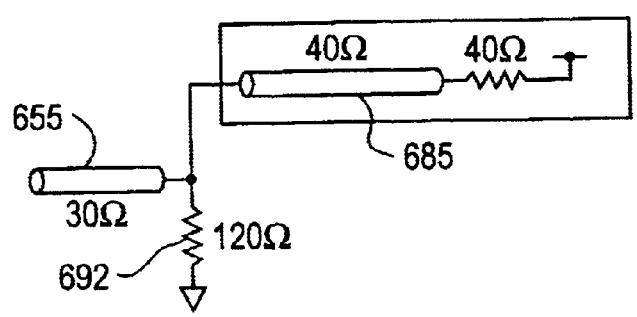

Other techniques may be employed to match impedances in the system, for example, in FIG. 6D, a stub line 690 is employed to match impedances. In this embodiment, transmission line 685 is terminated using a 40 ohm resistor. In yet other alternate embodiments, instead of being perfectly matched, impedances may be matched to be in the range of between 70 and 130 percent as described above in reference to Table 1.

In an embodiment of the present invention, the internal multi-drop transmission line may include an impedance in the range of between 10 to 75 ohms. Although shown as being disposed external to multi-chip device 680, external transmission line 690 may be also be disposed internally and, for example, be adjusted using fusible links.

With reference to FIGS. 7A and 7B, a cross-section representation of a multi-chip device having a plurality of IC die according to another embodiment of the present invention is illustrated. In these embodiments, two IC die "stacks" 810 and 820 are disposed on base 830. Here each of IC die stacks 810 and 820 are disposed in a similar configuration: as the plurality of IC die shown in FIG. 3A. The IC die stacks 810 and 820 may also be disposed in a manner which is similar to the configuration of FIG. 3B.

In these specific embodiments, conductor 850 is employed to couple conductors between IC stack 810 and IC stack 820. In the embodiment shown in FIG. 7A, conductor 850 is disposed of a printed circuit board (PCB). In the embodiment of FIG. 7B, conductor 850 is disposed on a flexible polyimide substrate. Conductors disposed on a flexible substrate will hereinafter be referenced to as flex tape to denote any one of a number of flexible substrate materials supporting conductors or conductive traces. One embodiment of flex tape is illustrated in FIG. 7C. For simplicity, four conductive traces 870a–870d (i.e., copper interconnect) are shown residing on flex tape 865. By way of note, portions of conductive trace 870d are indicated as extending over corresponding formed apertures 875a–875d. Each of these portions is notched so as to form a break in a predetermined location over each of apertures 875a–875d as will be described below.

With reference to FIGS. 7C and 7D, a method of forming a multi-chip device using flex tape according to an embodiment of the present invention will now be described. A plurality of IC die 880a–880d are formed and positioned as described above with reference to multi-chip device 400. Flex tape 865 is disposed such that each aperture is aligned over an proximal to pads exposed at a periphery region of IC die 880a–880d. Each portion of corresponding conductive traces 870a–870d that extend across each aperture (hereinafter referred to as "each portion") is broken at each notch location and bent to contact each pad situated beneath. In this embodiment a thermo-compression bonder applies mechanical force and heat to each portion to form the bond. The mechanical force forces a break to occur at the notched location. The mechanical force also causes each "broken" portion to extrude through each aperture to contact each pad. The heat and mechanical energy causes each portion to bond to each pad. The thermo-compression bonder includes a plurality of beams that provide the heat and linear motion perpendicular to the plane of flex tape 865. During the bond process, each small beam travels in a linear path perpendicular to the plane of the aperture toward the pad and applies heat when the contact is made between each portion and the pad.

With further reference to FIGS. 7A and 7B Multi-chip device 800 may be incorporated in a "flow-through" bus approach. More specifically, a portion of a system bus may be realized directly in multi-chip device 800. For simplicity, only one multi-drop transmission line is shown and it is understood that the bus includes a plurality of multi-drop transmission lines. A plurality of multi-chip device 800 may be coupled in a serial configuration permitting the signals to propagate through each multi-chip device in serial fashion. Multi-chip device 800 may be incorporated into a memory system with external termination elements (e.g., resistor elements) terminating each multi-drop transmission line at one end to avoid signal reflections. The termination element may also be implemented within one or more of the IC die of IC stack 810 and/or IC stack 820. In alternate embodiments, the termination element may be disposed on at least one IC die.

Opposite ends of the multi-drop transmission line may be coupled via leads or ball bonds situated proximal to or at corresponding ends of base 830. In operation, signals in a memory system (not shown) incorporating multi-chip device 800 may transport information such as clock, data, address information or control information via one end of the multi-drop transmission line, for example 860a. The signals propagate along conductors disposed between the IC die and exit at an opposite end of multi-drop transmission line, for example 860b. The opposite end of the multi-drop transmission line may be terminated to a termination voltage using a termination element (e.g., an external resistor) or may couple to another multi-drop transmission line in another multi-chip device 800. The direction of transport may also be bi-directional, i.e., signals may propagate from 860b to 860a and vice versa.

Figure 4A:
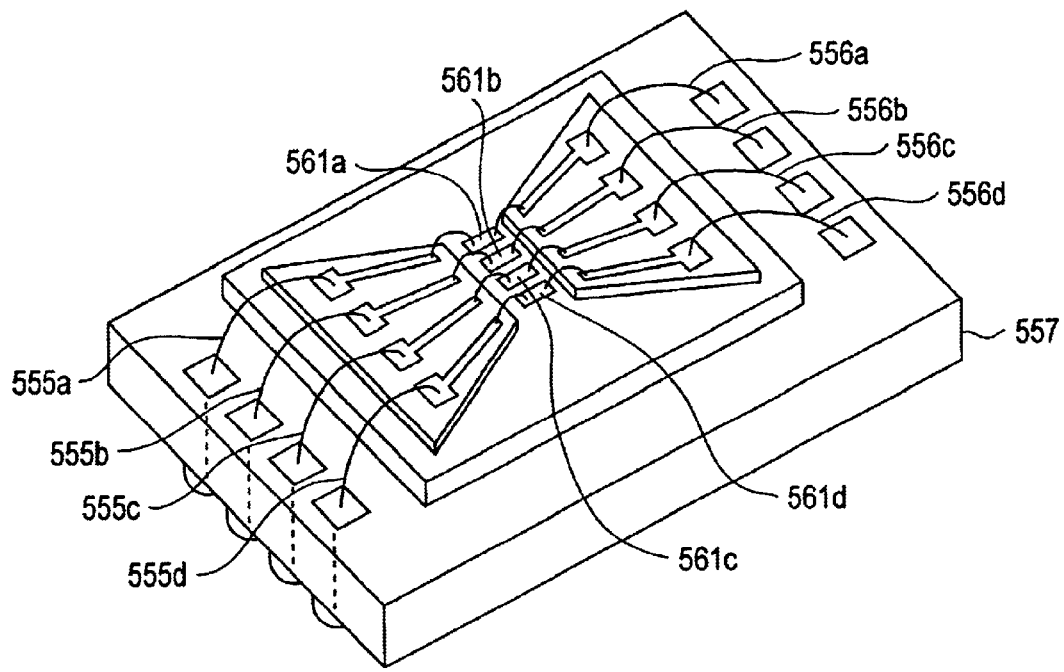
FIG. 4A illustrates a bond pad employed in a flow-through bus in accordance to an embodiment of the present invention.
Figure 4B:
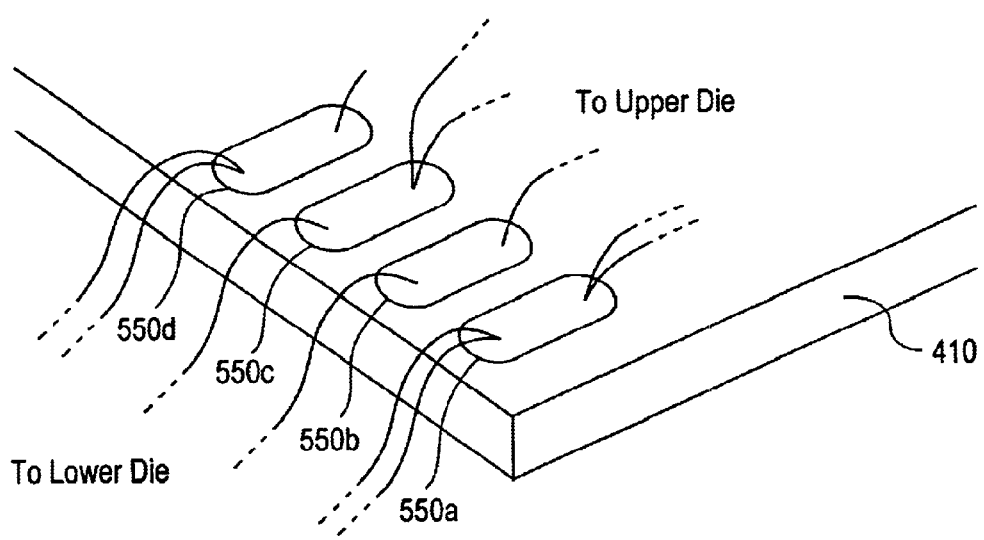
FIG. 4B illustrates a plurality of pads for coupling a plurality of conductors between two adjacent integrated circuit die in accordance to embodiments of the present invention.

FIG. 4A illustrates the broader concept of the flow-through approach according to an embodiment of the present invention. In the broadest concept, signal lines of a bus enter at one portion of IC package 557 and exit through another portion of IC package 557. A plurality of leads 555a–555d and 556a–556d each connected to a corresponding bond pad 561a–561d. This approach may be well suited for tape automated bonding (TAB) type packaging.

A stub is commonly known as a routed connection which deviates from the primary path of a signal line. Stubs are often created by leads and other packaging connections disposed to couple a conventional IC device to signal lines on a printed circuit board. Stubs which are too long may have adverse affects on a signal line, creating unwanted signal reflections. According to the present invention, the flow through approach alleviates stub lengths in the system normally created by conventional packaging I/O structures, such as leads. Indeed, the minimum interconnect is disposed between the signal line of the bus and the bond pad of the integrated circuit device.

In another embodiment, multi-chip device 800 may be coupled in series with multi-chip device 400 (FIG. 3A and/or FIG. 3B). This configuration benefits from an on-chip or integrated resistor terminating the end of each signal line of the bus. Thus, no external resistor is required in this approach.

Figure 8:
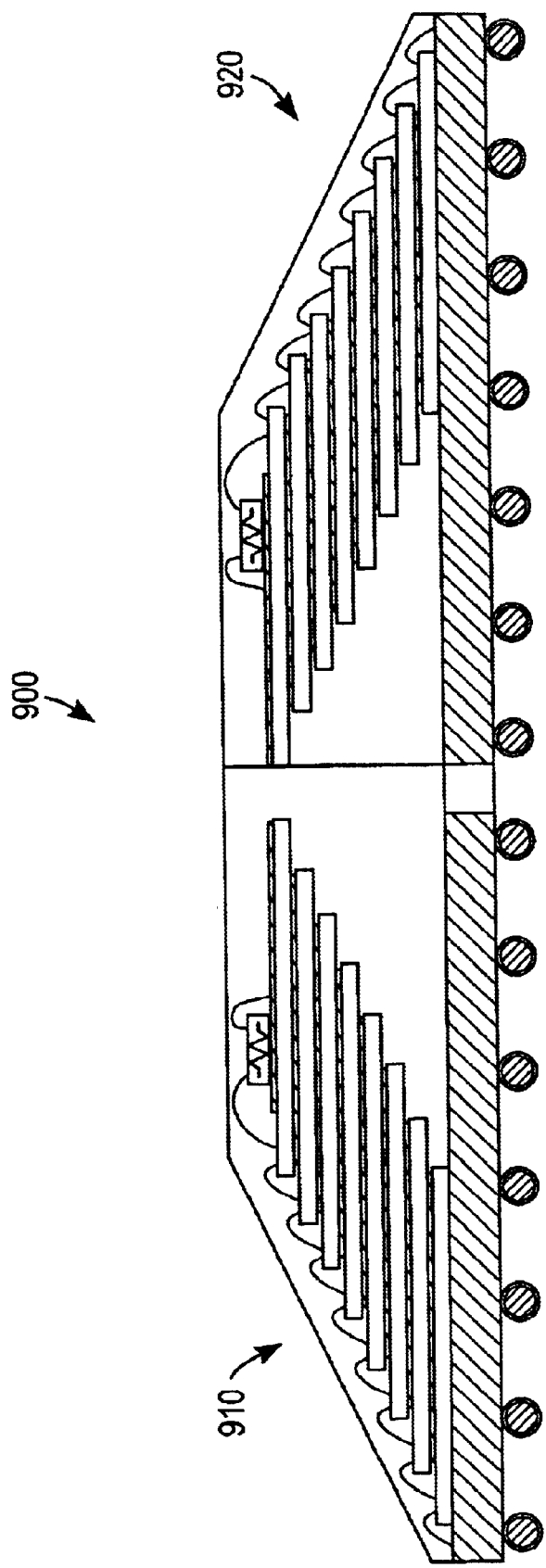

Several resistor terminated stacks, such as the resistor terminated stacks 910 and 920 shown in FIG. 8 may be incorporated into multi-chip device 900 and employed into, for example, a memory system which utilizes two independently operated busses. Here each bus may be coupled to each of resistor terminated stacks 910 and 920. Although, resistor terminated stacks 910 and 920 are the same as those shown in multi-chip device 400 in FIG. 3A, any stack configuration may be employed, such as those shown in FIG. 3B, and/or multi-chip device 800 from FIGS. 7A and 7B. Moreover, additional stacks may be incorporated into multi-chip device 900 depending on the number of independent busses employed in the memory system, for example, four stacks may be employed in a system configured with four independently operated busses.

Figure 9:
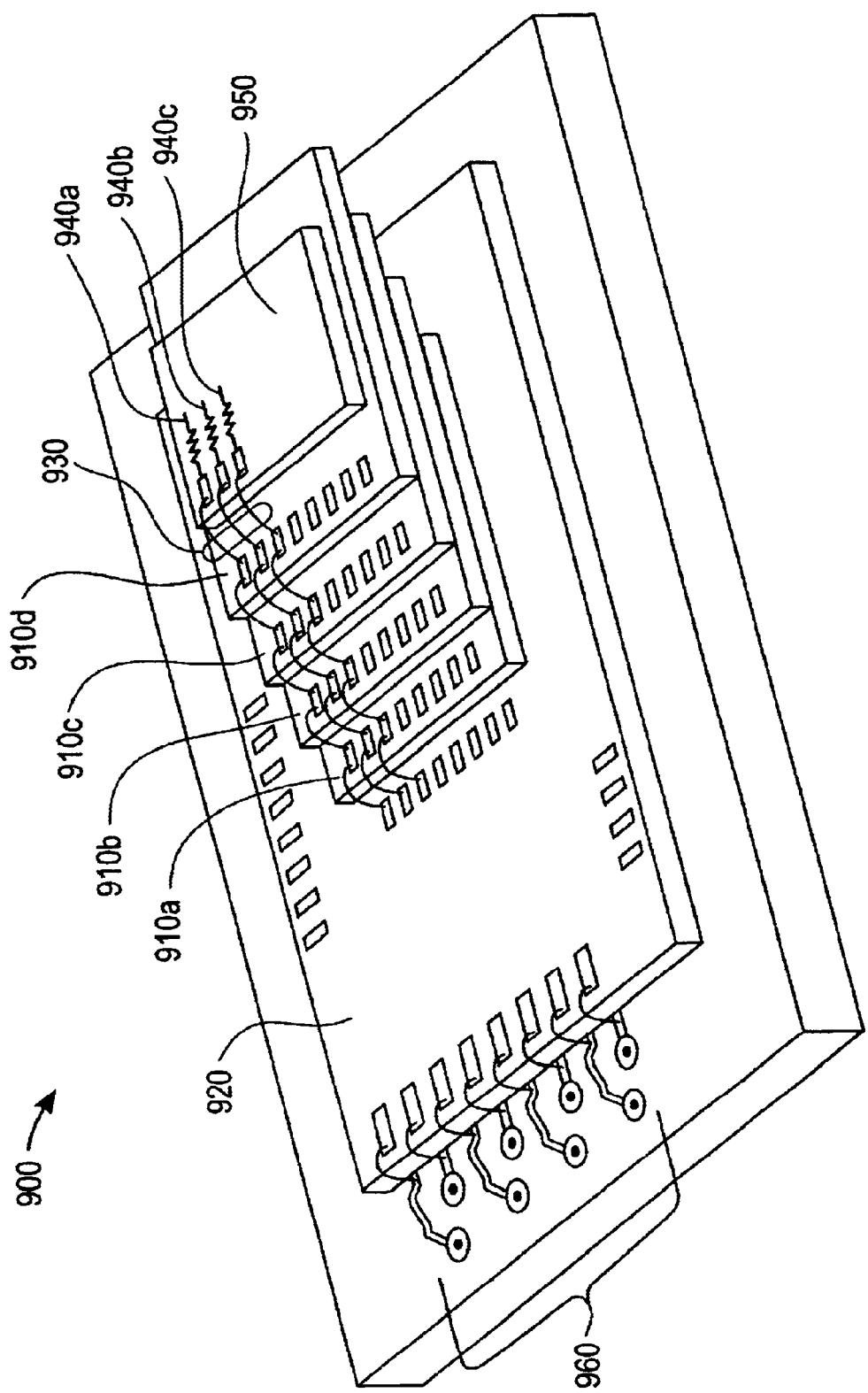

According to the present invention the plurality of IC die may comprise one or more types of IC devices for example, a plurality of memory die, a controller die and memory die, or a processor, controller and plurality of memory die. With reference to FIG. 9, a diagram representing a multi-chip device in accordance to another embodiment of the present invention is illustrated. In this embodiment multi-chip device 900 includes a plurality of stacked memory devices 910a–910d, and controller 920. Bus 930 comprising a plurality of controlled impedance multi-drop transmission lines (only three are shown for simplicity) couples memory devices 910a–910d to controller 920 and is bound "on-device". In this embodiment, resistor terminators 940a–940c are disposed on device 950 to terminate respective transmission lines of bus 930. A plurality of via connections 960 couple pads on the controller to external leads or solder balls (not shown) separately from bus effectively isolating bus to be on the multi-chip device.

While this invention has been described in connection with what is presently considered to be the most practical embodiments, it is to be understood that the invention is not limited to the disclosed embodiments. In this regard, one of ordinary skill in the art might readily recognize that the multi-chip device in accordance to the present invention may comprise various configurations in which a plurality of IC devices are disposed along a multi-drop transmission line and positioned on a base and/or housed inside an IC package. The multi-drop transmission line may be terminated at one or two ends or may be implemented in a flow-through approach. Indeed, the embodiments disclosed cover various modifications that are within the scope of the invention as defined in the following claims.

What is claimed is:

1. An integrated circuit (IC) device, comprising:
    a substrate connecting an external transmission line having a first impedance;
    a plurality of IC dies arranged in a stacked configuration on the substrate;
    a termination element having a second impedance; and
    a multi-drop transmission line connecting bond pads associated with selected ones of the plurality of IC dies between the external transmission line and the termination element, wherein the multi-drop transmission line has a third impedance matched to at least one of the first and second impedances.

2. The IC device of claim 1, wherein the third impedance matches at least one of the first and second impedances by a percentage in a range of from 70 percent to 130 percent.

3. The IC device of claim 1, further comprising an impedance matching stub line connected to the at least one of the external transmission line and the multi-drop transmission line.

4. The IC device of claim 1, wherein the plurality of IC dies comprises a first vertical stack of IC dies and a separate, second vertical stack of IC dies.

5. An integrated circuit (IC) device comprising:

an external transmission line having a first impedance;

a plurality of IC dies arranged in a stacked configuration; and a multi-drop transmission line having a second impedance and electrically connecting the plurality of the IC dies to the external transmission line, wherein the second impedance is matched to the first impedance.

6. The IC device of claim 4, wherein the external transmission line comprises a first segment having the first impedance and second segment having a third impedance; and wherein the multi-drop transmission line is connected in parallel with the second segment of the external transmission line such that the effective impedance of the parallel combination is matched to the first impedance.

7. The integrated circuit device of claim 1, wherein the multi-drop transmission line further comprises:

a first transmission line segment connecting the external transmission line and a first bond pad on a first IC die of the plurality IC dies;

a second transmission line segment connecting the first bond pad and a second bond pad on a second IC die of the plurality of IC dies; and, a third transmission line segment connecting to the terminal element a respective bond pad on an IC die of the plurality of IC dies other than the first IC die.

8. The integrated circuit device of claim 1, wherein the multi-drop transmission line comprises at least one bond wire and a flex tape.

9. The integrated circuit device of claim 1, including:

a plurality of multi-drop transmission lines;

a first plurality of pads disposed on a first IC die of the plurality of IC dies, wherein each pad of the first plurality of pads is electrically connected to a respective multi-drop transmission line of the plurality of multi-drop transmission lines; and a second plurality of pads disposed on a second IC die of the plurality of IC dies, wherein each pad of the second plurality of pads is electrically connected to a respective multi-drop transmission line of the plurality of transmission lines.

10. The integrated circuit device of claim 1, further comprising:

a first principal surface of the substrate mounting a first IC die of the plurality of IC dies, and a second principal surface of the substrate opposite the first principal surface comprising a ball grid array;

wherein the multi-drop transmission line is electrically connected to the external transmission line through a portion of the ball grid array.

11. The integrated circuit device of claim 1, the multi-drop transmission line comprising a first transmission line and the bond pads connecting to the first transmission line comprising respective first bond pads; the further comprising:

a second transmission line having a fourth impedance connecting at least a second bond pad on a respective IC die of the plurality of IC dies between a second external bus having a fifth impedance and a second termination element having a sixth impedance, wherein the fourth impedance is matched with at least one of the fifth impedance and sixth impedance.

12. The integrated circuit device of claim 11, wherein the external transmission line is a first external transmission line, the integrated circuit device further comprising:

a first principal surface of the substrate mounting a first IC die of the plurality of IC dies, and a second principal surface of the substrate opposite the first principal surface comprising a ball grid array;

wherein first transmission line is electrically connected to the first external transmission line through a first portion of the ball grid array and the second transmission line connects to the second external transmission line via a second portion of the ball grid array.

13. The integrated circuit device of claim 1, wherein the termination element is a resistor electrically connected between an end of the multi-drop transmission line and a voltage terminal.

14. The integrated circuit device of claim 1, wherein a resistance value for the termination element is matched to the third impedance.

15. The integrated circuit device of claim 1, further comprising a plurality of spacers, wherein each spacer is disposed between vertically adjacent IC dies of the plurality of IC dies, and wherein the plurality of IC dies and the plurality of spacers are encapsulated.

16. The integrated circuit device of claim 15, wherein the multi-drop transmission line comprises a plurality of segments, a first segment connecting the external bus to a first bond pad on a first IC die in the plurality of IC dies, additional segments respectively connecting bond pads between the vertically adjacent IC dies, and a final segment connecting a first bond pad on a last IC die in the plurality of IC dies to the termination element.

17. The integrated circuit device of claim 1, wherein a first IC die in the plurality of IC dies is a controller and at least one of the other IC dies in the plurality of IC dies is a memory device.

18. The integrated circuit device of claim 1, wherein an edge of a first IC die of the plurality of IC dies is offset with respect to an edge of a second IC die of the plurality of IC dies to expose a periphery region on the first IC die, and wherein a first conductive pad on the first IC die is disposed at the periphery region.

* * * * *

UNITED STATES PATENT AND TRADEMARK OFFICE
CERTIFICATE OF CORRECTION

PATENT NO.    : 6,621,155 B1
DATED         : September 16, 2003
INVENTOR(S)   : Donald V. Perino and Sayeh Khalili It is certified that error appears in the above-identified patent and that said Letters Patent is hereby corrected as shown below:

<u>Column 15,</u>
Line 9, correct "claim 4" to -- claim 5 --.

Signed and Sealed this

Twenty-fifth Day of October, 2005

JON W. DUDAS
*Director of the United States Patent and Trademark Office*